United States Patent [19]
Ramseyer et al.

[11] Patent Number: 5,699,009
[45] Date of Patent: Dec. 16, 1997

[54] ELECTRONIC FILTERING DEVICE

[75] Inventors: Mark S. Ramseyer, Livonia; Rollie M. Fisher, Trenton, both of Mich.; Rudolf Bettelheim, Buda, Tex.; Percy W. Wong; P. S. Sriram, both of Austin, Tex.

[73] Assignees: Ford Motor Company, Dearborn, Mich.; Motorola, Inc., Austin, Tex.

[21] Appl. No.: 626,160

[22] Filed: Apr. 1, 1996

[51] Int. Cl.$^6$ .................................................. H03K 5/00
[52] U.S. Cl. ............................ 327/552; 327/551; 327/34; 327/165
[58] Field of Search ...................................... 327/551, 552, 327/100, 384, 34, 36, 38, 41, 311, 117, 166, 165, 24; 377/47

[56] References Cited

FOREIGN PATENT DOCUMENTS 3044107   2/1991   Japan ............................ 327/166

*Primary Examiner*—Timothy P. Callahan
*Assistant Examiner*—Dinh T. Le
*Attorney, Agent, or Firm*—Peter Abolins, Esq.; Roger L. May, Esq.

[57] ABSTRACT

A filtering device for filtering noise from an electronic signal having a plurality of defined periods includes an input terminal for receiving the electronic signal, a period divider for dividing each of the definable periods into an equal number of subdivisions, a filter creating a latching signal for a predetermined portion of the number of subdivisions, and a latch for receiving the latching signal from the filter and for maintaining the electronic signal in steady state for a predetermined portion of the number of subdivisions.

13 Claims, 1 Drawing Sheet

ELECTRONIC FILTERING DEVICE

BACKGROUND OF THE INVENTION

1. Field of the Invention

The present invention relates generally to a filtering device and, more specifically, to an electronic filtering device capable of filtering a portion of a signal.

2. Description of Related Art

Ever since information has been transmitted via an electronic signal, there has been a need to filter noise out of that signal. Today, several applications have a need to autonomously filter an input signal. In particular, an automotive engine uses a sensed signal to determine the orientation of the crankshaft. Since the sensor senses teeth on a rotating shaft, each tooth and each subdivision of these tooth periods are in the angle domain. Likewise, transmission position and wheel speed sensing are performed in the angle domain. Currently, a central processing unit or other types of control circuits are required to externally modify a filter depending on the conditions in which the rotating shaft is operating, i.e., periods of positive and negative acceleration. These devices used to modify the filters externally add design costs and weight to weight-sensitive assemblies such as an automotive vehicle.

SUMMARY OF THE INVENTION

Accordingly, a filtering device for filtering noise from an electronic signal is disclosed. The filtering device includes an input terminal for receiving the electronic signals. A period divider divides each of the definable periods into an equal number of subdivisions. A filter creates a latching signal for a predetermined portion of the subdivisions. A latch receives the latching signal from the filter and maintains the electronic signal in a steady state for a predetermined portion of the number of subdivisions for that particular period.

One advantage of the present invention is the filter does not have to be modified to compensate for the frequency of an electronic signal received. Another advantage associated with the present invention is the reduction of weight and cost associated with inventory when required to maintain control of a separate filter externally.

Other advantages and features of the present invention will be readily appreciated as the same becomes better understood by reference to the subsequent description when considered in connection with the accompanying drawings.

DESCRIPTION OF THE PREFERRED EMBODIMENT(S)

Figure 1:
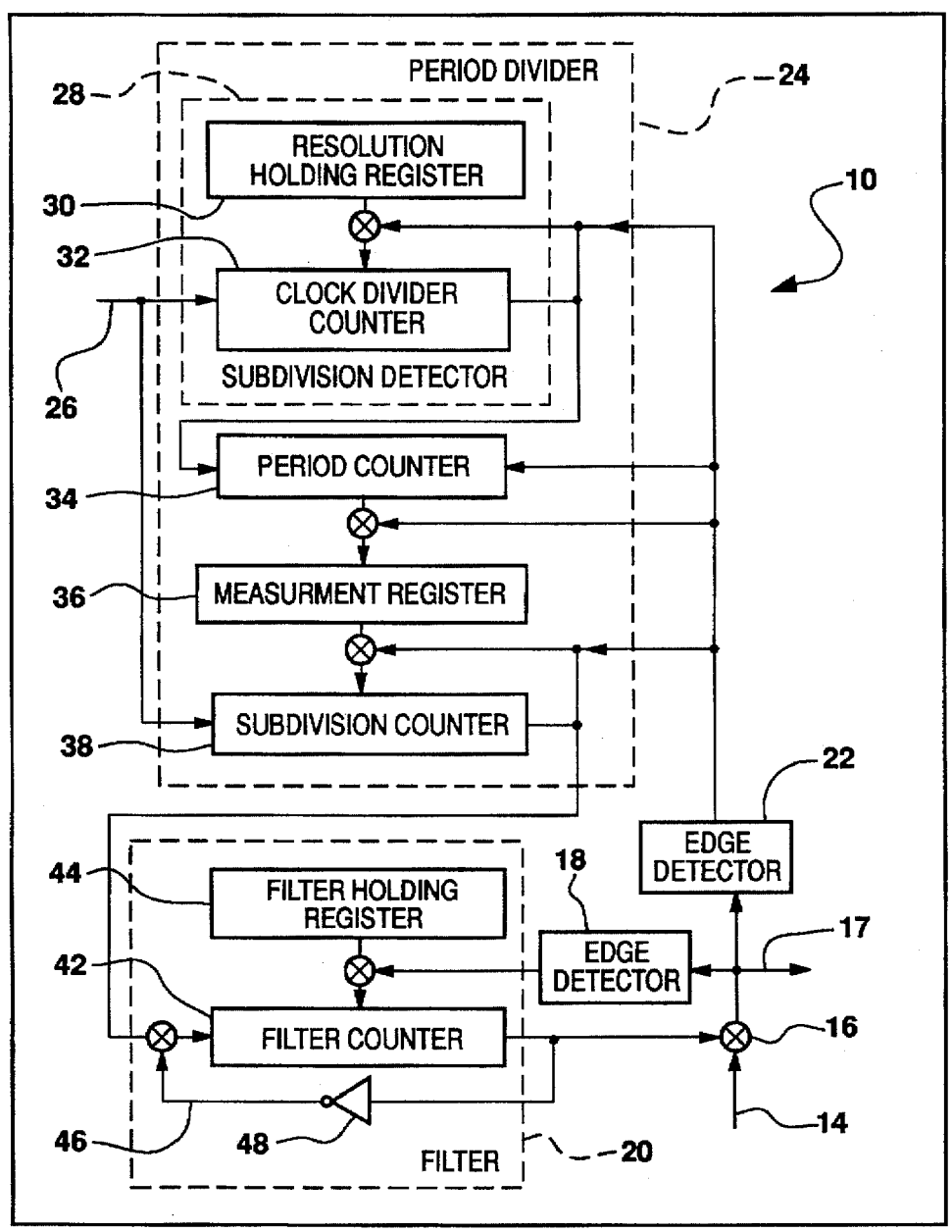
FIG. 1 is a block diagram of one embodiment of a filtering device according to the present invention.

Referring to FIG. 1, one embodiment of the present invention, a filtering device, is generally indicated at 10. The filtering device 10 filters noise from an electronic signal. As may be seen in FIG. 2, the electronic signal, as shown at 12, is unfiltered and includes a plurality of defined periods. The electronic signal 12 is unfiltered and each of the defined periods may be equal in length or, in the alternative, may vary in length. Although the electronic signal 12 is shown as a digital signal in FIG. 2, it may be appreciated by those skilled in the art that an analog signal may be filtered by the filtering device 10 just as a digital signal is.

The filtering device 10 includes an input terminal 14 for receiving the electronic signal 12 in its unfiltered state. The input terminal 14 may be connected directly to a sensor assembly or it may be sent through a conditioning assembly used to condition the signal prior to it being filtered. Neither the sensor nor the conditioning assemblies are shown in FIG. 1.

From the input terminal 14, the electronic signal 12 passes through a latch 16. The latch 16 may, in other embodiments, be a switch or a transistor. The latch 16 will be discussed in greater detail subsequently.

Once the electronic signal 12 passes through the latch 16, it is sent to an edge detector 18 prior to entering a filter 20. In addition, the electronic signal is sent through a second edge detector 22 prior to the electronic signal 12 entering a period divider 24. The period divider 24 also includes a clock input terminal 26 for receiving a clock input signal from a clock (not shown).

The period divider 24 divides each of the definable periods into an equal number of subdivisions. Each of the definable periods has the same number of subdivisions and, therefore, the subdivisions vary in size depending upon the length of the definable period being subdivided.

The period divider 24 includes a subdivision detector 28 which measures the length of each of the subdivisions created by the period divider 24. The subdivision detector 28 includes a resolution holding register 30. The resolution holding register 30 holds the desired number of subdivisions per signal period in which the definable period is to be subdivided. A clock divider counter 32 counts down from the number held in the resolution holding register 30 until it reaches zero. The clock divider counter 32 divides the clock signal into clock divisions having clock subperiods.

The output of the clock divider counter 32 is the input for a period counter 34. The period counter 34 counts the clocks subperiods. The period counter 34 also receives the filtered electronic signal after it passes through the second edge detector 22. The period counter 34 continuously measures the signal period in terms of the reduced clock subdivisions. Therefore, at the end of each definable period, the period counter 34 contains the definable period as measured by the addition of each subdivision.

The output of the period counter 34 is combined with the filtered electronic signal after an edge detection by the second edge detector 22 and becomes the input to a measurement register 36. The measurement register 36 captures the subdivision measurement and holds it as a value for a subdivision counter 38. The subdivision counter 38 continuously counts down from the value to zero using the original clock frequency. Therefore, a subdivision occurs every time the subdivision counter 38 counts down to zero.

The filter 20 which creates a latching signal for a predetermined portion of the number of subdivisions. More specifically, the filter 20 includes a filter counter 42 for counting the number of subdivisions the latch 16 is to maintain the electronic signal 12 in steady state, e.g., there will be no fluxuation in the electronic signal 12 for the predetermined portion of the number of subdivisions wherein a latching signal is produced. In an alternative embodiment, the filter counter 42 may be time based. The filter 40 also includes a filter holding register 44 which identifies the predetermined portion of the number of subdivisions which are to be blocked. The output of the filter holding register 44 is combined with the output of the first edge detector 18 and is a second input for the filter counter 42. A feedback loop 46 includes a NOT gate 48 which adds a signal to the signal received by the filter counter 42 from the subdivision counter 38 of the period divider 24. In yet another alternative embodiment, the filter holding register 44 may include two filter holding registers, one for each the rising edge and the falling edge of the electronic signal. In this alternative embodiment, the output of the edge detection 18 would be an input for both of the filter holding registers.

Figure 2:
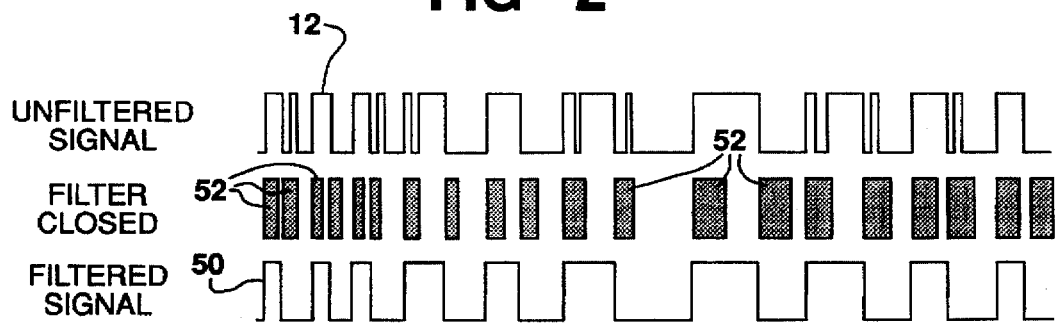
FIG. 2 is an example of an input and the resulting output of the filtering device of FIG. 1.

The filter counter 42 is reloaded every filtered signal edge from the filter holding register 44. The filter holding register 44 contains the block out time for filtering the input electronic signal 12. Therefore, the filter holding register 44 remains constant. While the filter counter 42 is counting down to zero, the unfiltered electronic signal 14 is blocked by the latch 16 such that any changes in the unfiltered electronic signal 12 will not be seen at the output 17 of the filtering device 10 to create the filtered electronic signal 50, as shown in FIG. 2. The latching signals, represented by rectangles 52 in FIG. 2, block out the noise which may be generated in close proximity to an edge in the unfiltered electronic signal 12, either in a positive edge, a negative edge, or both. The amount of time the latch 16 is blocking information received by the unfiltered electronic signal 12 is directly dependent upon the frequency of the particular period being filtered at that time. In one embodiment, the latch 16 may be replaced with a switch or a transistor wherein a separate latching circuit may be employed outside the filtering device 10. In such an alternative embodiment, the filter will create a switching signal similar to the latching signal.

In yet another embodiment, the unfiltered electronic signal 12 may be directly connected to the edge detector 18, bypassing the latch 16. In this embodiment, the filter 20 would be retriggerable and activate the latch 16 whenever noise is present.

The present invention has been described in an illustrative manner. It is to be understood that the terminology which has been used is intended to be in the nature of words of description rather than of limitation.

Many modifications and variations of the present invention are possible in light of the above teachings. Therefore, within the scope of the appended claims, the present invention may be practiced otherwise than as specifically described.

What is claimed is:

1. A filtering device for filtering noise from an electronic signal having a plurality of predetermined periods, said filtering device comprising:

an input terminal for receiving the electronic signal;

a period divider for dividing each of the predetermined periods into an equal number of subdivisions;

a filter coupled to said period divider and an edge detector for generating a latching signal for a predetermined portion of the number of subdivisions;

a latch for receiving the latching signal from said filter and the electronic signal for maintaining the electronic signal in steady state for said predetermined portion of the number of subdivisions, wherein said edge detector detects edges in the electronic signal, said edge detector connected between said latch and said period divider.

2. A filtering device as set forth in claim 1 wherein said period divider includes a clock input terminal to receive a clock signal.

3. A filtering device as set forth in claim 2 wherein said period divider includes a clock divider counter for dividing the clock signal into clock divisions having clock subperiods.

4. A filtering device as set forth in claim 3 wherein said period divider includes a subdivision detector for measuring the clock subperiods.

5. A filtering device as set forth in claim 1 wherein said period divider includes a subdivision counter.

6. A filtering device as set forth in claim 5 wherein said period divider includes a measurement register for storing each of the clock subperiods.

7. A filtering device as set forth in claim 6 herein said period divider includes a period counter for counting the clock subperiods, said period counter receiving the clock subperiods from said subdivision detector.

8. A filtering device as set forth in claim 4 wherein said subdivision detector includes a resolution holding register identifying the number of subdivisions.

9. A filtering device as set forth in claim 1 wherein said filter includes a filter holding register storing said predetermined portion.

10. A filtering device as set forth in claim 1 wherein said filter includes a filter counter for counting the number of subdivisions said latch is maintaining the electronic signal in steady state.

11. A filtering device as set forth in claim 1 wherein a second edge detector is connected between said input terminal and said filter to detect edges in the electronic signal.

12. A filtering device for filtering noise from an electronic signal having a plurality of predetermined periods, said filtering device comprising:

an input terminal for receiving the electronic signal;

a period divider for dividing each of the predetermined periods into an equal number of subdivisions;

a filter coupled to said period divider and an edge detector for generating a switching signal for a predetermined portion of the number of subdivisions;

a switch for receiving the switching signal from the filter and the electrical signal for maintaining the switching signal in steady state for said predetermined portion of the number of subdivisions, wherein said edge detector detects edges in the electronic signal, said edge detector connected between said latch and said period divider.

13. A filtering device for filtering noise from an electronic signal having a plurality of predetermined periods, said filtering device comprising:

an input terminal for receiving the electronic signal;

a period divider for dividing each of the predetermined periods into an equal number of subdivisions;

a filter coupled to said period divider and an edge detector for generating a latching signal for a predetermined portion of the number of subdivisions;

a latch for receiving the latching signal from said filter and the electrical signal for maintaining the electronic signal in steady state for said predetermined portion of the number of subdivisions, wherein said edge detector detects edges in the electronic signal, said edge detector connected between said latch and said period divider.

* * * * *